(12) United States Patent
Maling et al.

(10) Patent No.: US 10,227,230 B2
(45) Date of Patent: Mar. 12, 2019

(54) SEMICONDUCTOR STRUCTURES PROVIDED WITHIN A CAVITY AND RELATED DESIGN STRUCTURES

(71) Applicant: INTERNATIONAL BUSINESS MACHINES CORPORATION, Armonk, NY (US)

(72) Inventors: Jeffrey C. Maling, Grand Isle, VT (US); Anthony K. Stamper, Burlington, VT (US); Dana R. DeReus, Santa Ana, CA (US); Arthur S. Morris, III, Raleigh, NC (US)

(73) Assignees: INTERNATIONAL BUSINESS MACHINES CORPORATION, Armonk, NY (US); WISPRY, INC., Irvine, CA (US)

( * ) Notice: Subject to any disclaimer, the term of this patent is extended or adjusted under 35 U.S.C. 154(b) by 0 days.

(21) Appl. No.: 16/031,257

(22) Filed: Jul. 10, 2018

(65) Prior Publication Data

US 2018/0319653 A1    Nov. 8, 2018

Related U.S. Application Data

(60) Continuation of application No. 14/730,346, filed on Jun. 4, 2015, now Pat. No. 10,081,534, which is a division of application No. 13/591,771, filed on Aug. 22, 2012, now Pat. No. 9,102,517.

(51) Int. Cl.
| | |
|---|---|
| *B81B 3/00* | (2006.01) |
| *B81C 1/00* | (2006.01) |
| *H01H 1/00* | (2006.01) |
| *H01L 23/34* | (2006.01) |
| *H01L 29/84* | (2006.01) |

(52) U.S. Cl.
CPC ........ *B81B 3/0072* (2013.01); *B81C 1/00333* (2013.01); *B81C 1/00825* (2013.01); *H01L 23/34* (2013.01); *H01L 29/84* (2013.01); *B81B 2201/018* (2013.01); *B81B 2203/0118* (2013.01); *B81C 2203/0136* (2013.01); *B81C 2203/0145* (2013.01); *H01H 1/0036* (2013.01); *H01L 2924/0002* (2013.01)

(58) Field of Classification Search
CPC ............................... H01L 23/34; H01L 29/84
See application file for complete search history.

(56) References Cited

U.S. PATENT DOCUMENTS

| | | |
|---|---|---|
| 7,131,628 B2 | 11/2006 | Feinberg et al. |
| 7,582,514 B2 | 9/2009 | Vancura et al. |
| 7,629,657 B2 | 12/2009 | Partridge et al. |
| 7,659,150 B1 | 2/2010 | Monadgemi et al. |
| 7,723,141 B2 | 5/2010 | Robert |
| 7,863,070 B2 | 1/2011 | Colgan et al. |

(Continued)

*Primary Examiner* — Amar Movva

(74) *Attorney, Agent, or Firm* — Steven Meyers; Andrew M. Calderon; Roberts Mlotkowski Safran Cole & Calderon, P.C.

(57) ABSTRACT

Micro-Electro-Mechanical System (MEMS) structures, methods of manufacture and design structures are disclosed. The method includes forming at least one Micro-Electro-Mechanical System (MEMS) cavity. The method for forming the cavity further includes forming at least one first vent hole of a first dimension which is sized to avoid or minimize material deposition on a beam structure during sealing processes. The method for forming the cavity further includes forming at least one second vent hole of a second dimension, larger than the first dimension.

11 Claims, 5 Drawing Sheets

(56) References Cited

U.S. PATENT DOCUMENTS

| | | |
|---|---|---|
| 8,112,882 B2 | 2/2012 | Baillin et al. |
| 2008/0168411 A1 | 7/2008 | Mang et al. |
| 2010/0052107 A1 | 3/2010 | Bauer |
| 2010/0297336 A1 | 11/2010 | True |
| 2011/0314669 A1 | 12/2011 | Stamper et al. |
| 2011/0318861 A1 | 12/2011 | Jahnes et al. |
| 2012/0025331 A1 | 2/2012 | Anderson et al. |

A = 1um hole size
B = 1.5um hole size

SEMICONDUCTOR STRUCTURES PROVIDED WITHIN A CAVITY AND RELATED DESIGN STRUCTURES

FIELD OF THE INVENTION

The invention relates to semiconductor structures and methods of manufacture and, more particularly, to structures provided within a cavity, methods of manufacture and design structures.

BACKGROUND

Integrated circuit switches used in integrated circuits can be formed from solid state structures (e.g., transistors) or micro electro mechanical systems (MEMS), formed from passive wires inside a hermetically sealed cavity. Other devices formed inside a cavity include bulk acoustic wave filters (BAW filters) or resonators (BAR); or motion detectors and accelerometers, as examples. MEMS switches are typically employed because of their almost ideal isolation, which is a critical requirement for wireless radio applications where they are used for mode switching of power amplifiers (PAs) and their low insertion loss (i.e., resistance) at frequencies of 10 GHz and higher. MEMS switches can be used in a variety of applications, primarily analog and mixed signal applications. One such example is cellular telephone chips containing a power amplifier (PA) and circuitry tuned for each broadcast mode.

For illustrative purposes, a focus on MEMS switch devices will be discussed herein, although the discussion applies to any device formed inside a cavity. Depending on the particular application and engineering criteria, MEMS structures can come in many different forms. For example, a MEMS can be realized in the form of a cantilever beam structure. In the cantilever beam structure, a cantilever arm (suspended electrode with one end fixed) is pulled toward a fixed electrode by application of an actuation voltage. The voltage required to pull the suspended electrode to the fixed electrode by electrostatic force is called pull-in voltage, which is dependent on several parameters including the length of the suspended electrode, spacing or gap between the suspended and fixed electrodes, and spring constant of the suspended electrode, which is a function of the materials and their thickness. Alternatively, the MEMS beam could be a bridge structure, where both ends are fixed.

MEMS can be manufactured in a number of ways using a number of different tools. In general, though, the methodologies and tools are used to form small structures with dimensions in the micrometer scale with switch dimensions of approximately 5 microns thick, 100 microns wide, and 200 microns long. Also, many of the methodologies, i.e., technologies, employed to manufacture MEMS have been adopted from integrated circuit (IC) technology. For example, almost all MEMS are built on wafers and are realized in thin films of materials patterned by photolithography processes on the top of the wafer. In particular, the fabrication of MEMS uses three basic building blocks: (i) deposition of thin films of material on a substrate, (ii) applying a patterned mask on top of the films by photolithography imaging, and (iii) etching the films selectively to the mask.

In MEMS cantilever type switches, the beam and other components of the switch are manufactured using a series of conventional photolithography, etching and deposition processes. In one example, a layer of sacrificial material, e.g., spin-on polymer PMGI made by Microchem, Inc. is deposited under and over the beam structure, which is vented to form a cavity. Specifically, the cavity is formed by venting the sacrificial material through vent holes. To seal the vent holes, a sealing material, e.g., oxide, is deposited within the vent holes. Alternative sacrificial cavity materials include silicon and silicon dioxide. However, it has been found that in conventional processes the sealing material deposits on the free end (moving end) of the cantilever beam, which significantly changes the stress gradient of the beam and affects the MEMS performance. This sealing process has been found to contribute the highest process variability to the build structure. Illustratively, the material on the free end of the cantilever beam can affect the pull-in voltage, the zero voltage capacitance of the beam, e.g., make the Cmin unstable, in addition to inadvertently causing actuation of the MEMS structure, upon the application of an RF signal. In still additional problems, it has been found that some cavity sealing techniques distort the beam shape and significantly affects beam shape variability. Another problem which has been identified is degraded MEMS cycling properties and MEMS beam bounce after switching.

Accordingly, there exists a need in the art to overcome the deficiencies and limitations described hereinabove.

BRIEF SUMMARY

In a first aspect of the invention, a method comprises forming at least one cavity. The method for forming the cavity further comprises forming at least one first vent hole of a first dimension which is sized to avoid or minimize material deposition on a structure during sealing processes. The method for forming the cavity further comprises forming at least one second vent hole of a second dimension, larger than the first dimension.

In another aspect of the invention, a method of forming a structure comprises: forming a beam; forming first vent holes having a first size over a free portion of the cantilever beam; forming second vent holes having a second size larger than the first size over a fixed portion of the cantilever beam; venting a cavity around the cantilever beam, through the first vent holes and the second vent holes; forming a first layer to seal the first vent holes and partially seal the second vent holes; and forming a second layer to seal the second vent holes and the cavity.

In yet another aspect of the invention, a structure comprises a beam structure located within a cavity. The structure further comprises at least one vent hole positioned over a free end of the beam structure. The at least one vent hole having a first size which prevents or minimizes material deposition on the free end of the beam structure. The structure further comprises at least another vent hole positioned over a fixed end of the beam structure, the at least another vent hole having a second size, larger than the first size.

In still yet another aspect of the invention, a structure comprises a MEMS cantilever beam located within a cavity and having a fixed end and a moving end. The structure further comprises a first set of vent holes positioned over the moving end of the MEMS cantilever beam. The structure further comprises a second set of vent holes positioned over the fixed end of the MEMS cantilever beam. The structure further comprises a first material sealing the first set of vent holes and partially depositing on corners of the second set of vent holes. The structure further comprises a second material sealing the second set of vent holes, such that a combination of the first material and the second material are provided over the second set of vent holes.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the semiconductor structure, which comprises the structures of the present invention. In still further embodiments, a method in a computer-aided design system is provided for generating a functional design model of the semiconductor structure. The method comprises generating a functional representation of the structural elements of the semiconductor structure.

In embodiments, the method is provided in a computer-aided design system for generating a functional design model of a structure. The method comprises: generating a functional representation of a beam structure located within a cavity; generating a functional representation of at least one vent hole positioned over a free end of the beam structure, the at least one vent hole having a first size; and generating a functional representation of at least another vent hole positioned over a fixed end of the beam structure, the at least another vent hole having a second size, larger than the first size.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to structures provided within a cavity, methods of manufacture and design structures. In embodiments, the structures can be, for example, Micro-Electro-Mechanical System (MEMS) structures, accelerometers, filters, oscillators, resonators, acoustic wave devices, etc., any of which can be provided within a sealed cavity structure. Advantageously, the methods of forming the structures of the present invention significantly reduce material variability on the structure, e.g., MEMS beam, itself. In one example, the reduction of material variability on the beam solves many of the issues which have now been found to exist with MEMS structures, including, for example, providing the following advantages:

(i) stabilizing pull-in voltage issues and Cmin;
(iii) preventing inadvertent actuation of the MEMS structure, upon the application of an RF signal;
(iii) significantly reducing beam shape variability;
(iv) improving MEMS cycling properties;
(v) improving yields; and
(v) significantly reducing or eliminating MEMS beam bounce or vibration after switching.

In embodiments, the advantages of the present invention are achieved by forming different sized vent holes over a semiconductor structure, e.g., MEMS cantilever beam, during formation of the cavity. The use of different sized vent holes, and particularly, smaller vent holes over the moving end (e.g., free end) of a cantilevered beam, reduces and/or eliminates sealing material from depositing on the moving end of the cantilevered beam. For example, during a lower pressure deposition process, the sealing material will pinch off or seal the smaller vent holes without depositing any material on the structure. This allows a second, high pressure deposition process to completely seal the cavity without depositing material on the moving end of the structure. Instead, during the high pressure deposition, e.g., a Sub-Atmospheric Pressure Chemical Vapor Deposition (SACVD) process, sealing material will only form on a fixed side of the structure provided within the cavity, e.g., cantilevered beam. However, the material deposition on the fixed side of the structure provided within the cavity, e.g., cantilevered beam, will not pose the same issues as noted above. The low and high pressure processes are given for illustrative purposes only.

FIGS. 1-5 show structures and related processing steps in accordance with aspects of the invention. The processes disclosed herein are for the fabrication of any structure provided within a cavity. For example, the structure can be a MEMS capacitor switch, ohmic contact switches, MEMS accelerometers, oscillators, resonators, etc. Also, it should be understood by those of skill in the art that the structures disclosed herein can be formed using different materials and different processes, to form, for example, different MEMS beams or other structures.

Figure 1:
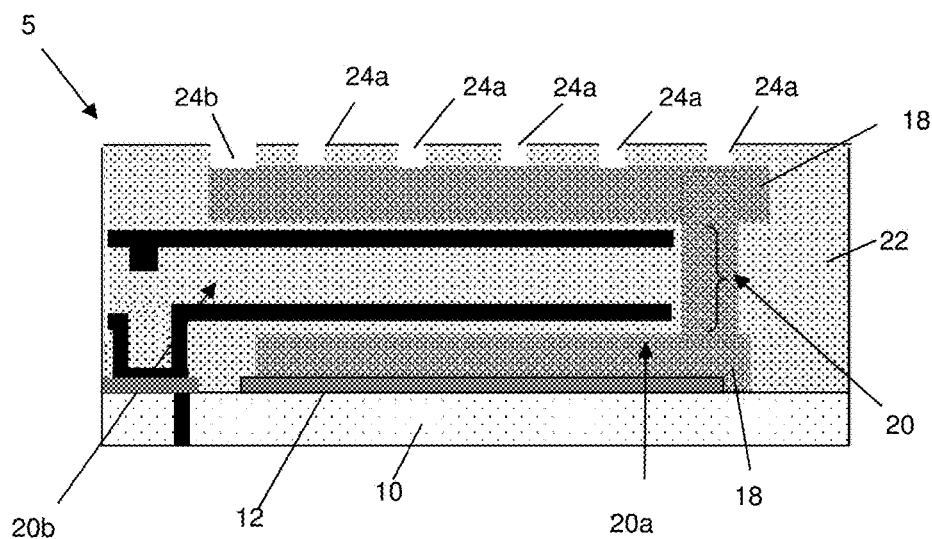
FIGS. 1-5 show fabrication processes and respective structures in accordance with aspects of the present invention.

FIG. 1 shows an intermediate structure and related processing steps in accordance with aspects of the invention. The structure 5 includes, for example, a substrate 10. The substrate 10, in embodiments, can be any layer of a device. In embodiments, the substrate 10 is an oxide or other insulator material known to those of skill in the art. As should be known to those of ordinary skill in the art, the substrate 10 can be implemented in either an SOI wafer or BULK implementation, or could be an insulating substrate such as sapphire or silica glass. Substrate 10 could contain wires, passives, transistors, etc. as known in the art. The constituent materials of the SOI wafer or BULK implementation may be selected based on the desired end use application of the semiconductor device. For example, the insulation layer, e.g., BOX, may be composed of oxide, such as $SiO_2$. Moreover, the active semiconductor layer can be comprised of various semiconductor materials, such as, for example, Si, SiGe, SiC, SiGeC, etc. The SOI wafer may be fabricated using techniques well known to those skilled in the art. For example, the SOI wafer may be formed by conventional processes including, but not limited to, oxygen implantation (e.g., SIMOX), wafer bonding, etc.

In FIG. 1, wiring layers and interconnects are provided on the substrate 10, depending on the specific design parameters of the semiconductor device. These wiring layers and interconnects are generally shown at reference numeral 12, and can be manufacturing using known materials and processes. By way of example, an interconnect can be a tungsten or copper stud formed in a conventionally formed via using any conventional lithography, etching and deposition processes, known to those of skill in the art for forming studs. The wiring can be formed into one or more wires using conventional deposition and patterning processes. For example, the wires can be a refractory metal such as Ti, TiN, TaN, Ta, and W, or AlCu, AlCuSi, amongst other wiring materials. It should also be understood by those of skill in the art that optional insulator material can be formed over the wires, depending on the design criteria.

Still referring to FIG. 1, a sacrificial material 18 can be deposited on the substrate 10 using a conventional plasma vapor deposition (PVD), plasma enhanced chemical vapor deposition (PECVD), or any known process. In embodiments, the sacrificial material 18 surrounds a structure 20, formed using conventional deposition, lithography and etching steps. The structure 20 can be, for example, MEMS capacitor switch, ohmic contact switches, MEMS accelerometers, oscillators, resonators, etc. Of course, other structures formed within a cavity are also contemplated by the present invention.

In specific embodiments, the sacrificial material 18 can be, for example, silicon, tungsten, tantalum, germanium, or any material which can subsequently be selectively removed using, for example $XeF_2$ gas, to an insulator material or the wires 12 (if the insulator material is absent), and the structure 20. Alternatively, any sacrificial material, such as a spin-on polymer could be used by the present invention. The sacrificial material 18 can be deposited using any conventional plasma vapor deposition (PVD), PECVD, rapid thermal CVD (RTCVD), or LPCVD, which operates at temperatures compatible with the wires 12 or other structures, e.g., <420° C. In embodiments, the sacrificial material 18 is deposited during several deposition steps, in order to surround the structure 20.

By way of example, a first layer of sacrificial material can be deposited within a pattern of a dielectric material 22, e.g., oxide. The first layer of sacrificial material 18 can be deposited, for example, to a height of about 0.1 to 10 µm which is determined by a gap requirement, and is patterned using conventional lithography and reactive ion etching (RIE) steps. After formation of the structure 20, as discussed in more detail below, additional sacrificial material 18 can be deposited to surround the structure 20. In embodiments, the sacrificial material 18 can be planarized using, e.g., chemical mechanical polishing (CMP). Additional insulator material 22 can then be deposited over the sacrificial material 18. In embodiments, the insulator material 22 can be planarized, e.g., to be planar (e.g., flat or planar surface), using conventional CMP processes.

In embodiments, as one illustrative non-limiting example, the structure 20 can be a MEMS beam formed by several deposition, lithography and etching steps. For example, an insulator material or lower electrode can be formed, e.g., deposited, on the first layer of sacrificial material 18. In embodiments, the lower electrode can be, for example, AlCu, AlCuSi, TiN, TaN, Ta or W, amongst other materials contemplated by the invention; whereas, the insulator material can be an oxide. If an insulator material is formed first, the lower electrode would be deposited on top of the insulator material. An insulator material is conformally deposited over the lower electrode by PECVD TEOS (oxide), e.g., to a height of about 0.1 to 2 µm; although other dimensions are also contemplated by the present invention. An upper electrode is formed over the insulator material. In embodiments, the upper electrode can be, for example, AlCu; although other materials are contemplated by the invention, e.g., TiN, TaN, Ta, or W, amongst other materials. In embodiments, the upper electrode has a thickness which balances the overall volume of the device, and hence not place undue stresses on the beam of the MEMS structure. An insulator material (capacitor oxide) can be deposited on the upper electrode. A beam structure (suspended cantilever electrode) can then be formed by removing portions of the materials forming the beam, e.g., insulator materials and electrodes. It should be understood by those of ordinary skill in the art that the constituent materials of the beam structure (suspended electrode) can vary depending on the application of the MEMS structure, and can be formed with multiple masks or a single mask. Similar deposition, lithography and etching steps can be used to form other structures 20.

Still referring to FIG. 1, after patterning and/or planarizing the insulator layer 22, e.g., oxide material, vent holes 24a and 24b are opened in the insulator layer 22, exposing a portion of the underlying sacrificial material 18. The vent holes 24a, 24b can be formed using conventional lithography and etching processes, known to those of skill in the art. In more specific embodiments, one or more vent holes 24a are formed over a cantilevered or moving end 20a of the structure (suspended electrode) 20; whereas, one or more vent holes 24b are formed over a fixed side 20b of the structure (suspended electrode) 20.

Figure 2:
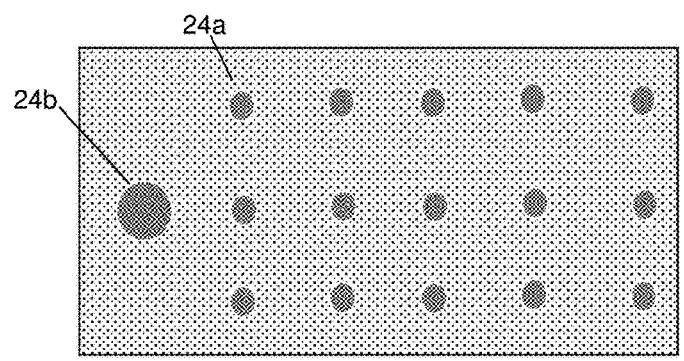

As shown in both FIGS. 1 and 2, the vent holes 24a, 24b are of a different size, i.e., the one or more vent holes 24a are smaller than the one or more vent holes 24b, in order to prevent or minimize material from depositing on the moving end 20a of the structure 20 during subsequent sealing processes. In embodiments, the diameter of the one or more vent holes 24a, 24b can range in size, e.g., from about 0.5 µm to 5.0 µm. In embodiments, the ratio of hole sizes can be over this entire range, depending on the thickness of oxide deposition planned to pinch them off. For example, above 5 µm, over 10 µm of oxide deposition would be required to seal the vent hole. In embodiments, the vent holes 24a, 24b expose portions of the sacrificial material 18 for subsequent venting processes. In embodiments, the exposed sacrificial material 18 can be cleaned with an HF solution.

In more specific embodiments, the one or more vent holes 24a are sized and/or shaped to be pinched off or sealed prior to the one or more vent holes 24b over a fixed side 20b of the structure 20, during a cavity sealing deposition process. For example, this can be accomplished by having the one or more vent holes 24a smaller than the one or more vent holes 24b. As an example, the one or more vent holes 24a are each about 1 µm in diameter and the one or more vent holes 24b are each about 1.5 µm in diameter, based on a PECVD silane oxide deposition and a SACVD sealing deposition process. In still further embodiments, the size and/or shape of the one or more vent holes 24a can be fine tuned according to the deposition processes used to seal the cavity after venting processing. In any scenario, the size and/or shape of the one or more vent holes 24a will prevent material from depositing on the moving end 20a of the structure (e.g., suspended electrode) 20, during the sealing of the cavity structure. This, in turn, will provide the many advantages of the present invention, as discussed herein.

Figure 3:
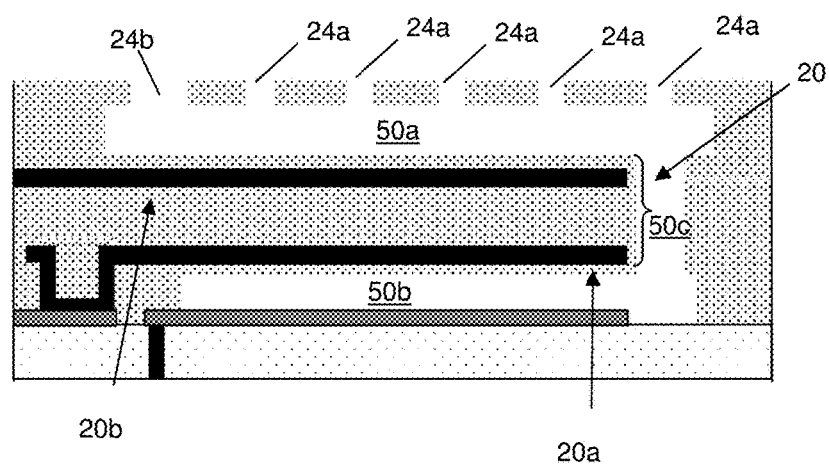

In FIG. 3, the sacrificial material 18 is stripped or vented by way of the vent holes 24a, 24b formed in the insulator layer 22. In embodiments, the stripping (e.g., etching) can be performed using a $XeF_2$ etchant through the vent holes 24a, 24b. The etching will remove the sacrificial material (e.g., silicon), forming an upper cavity 50a, a lower cavity 50b and a connecting via 50c.

Figure 4:
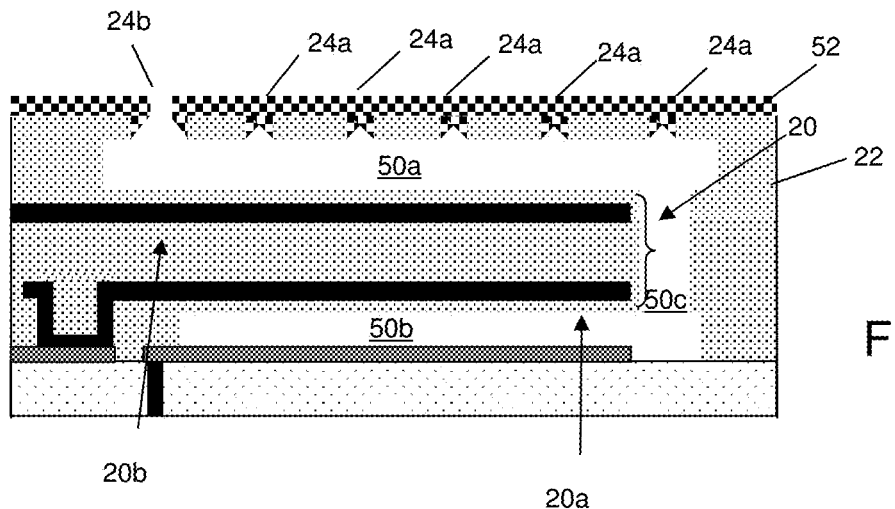

As shown in FIG. 4, the vent holes 24a can be sealed or substantially sealed with a dielectric material 52. For example, in embodiments, a PECVD silane oxide process will plug or seal vent holes 24a while depositing little or no material on the moving end 20a of the structure 20. As further shown in FIG. 4, the dielectric material 52 will also deposit on the surface of the insulator material 22, and edges of the vent hole 24b; however, the vent holes 24b will not be entirely sealed due to its larger size. In this way, the size and/or shape of the one or more vent holes 24a will prevent material from depositing on the moving end 20a of the structure (e.g., suspended electrode) 20, during the sealing of the cavity structure, thereby preventing added stress from being applied to the structure 20. This, in turn, will provide the many advantages of the present invention, as discussed herein.

As shown in FIG. 4, the PECVD process will only partially form on the corners of the vent holes 24b due to their larger size. That is, the initial deposition process will result in "breadloafing" (e.g., selective deposition on the corners of the hole) or partial sealing of the vent hole 24b, causing the vent hole 24b to become smaller over the fixed side 20b of the structure 20. In embodiments, the deposition process will result in the diameter of the vent holes 24b decreasing to a diameter of about 0.3 microns; although other dimensions are contemplated by the present invention, depending on the deposition processes used to seal the cavity.

Figure 5:
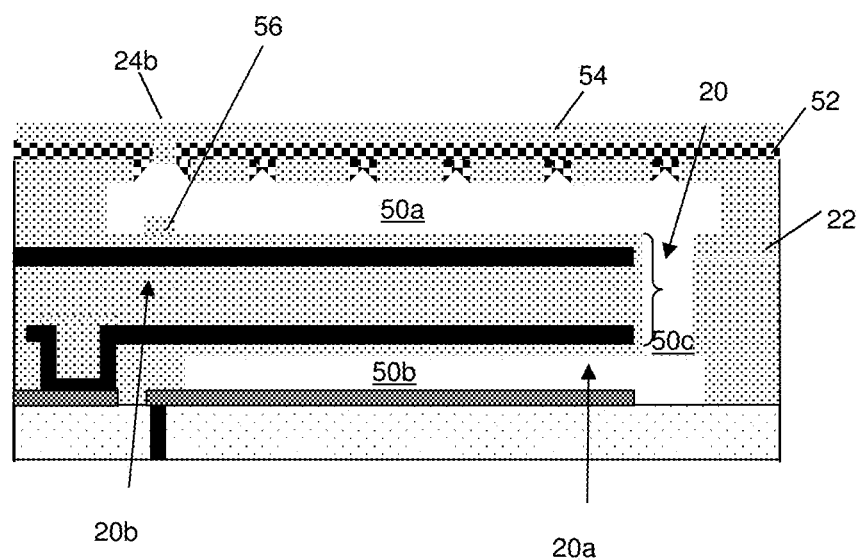

In FIG. 5, a second deposition process, e.g., SACVD, seals the vent holes 24b and forms a layer 54 over the entire structure of about 0.5 µm. In embodiments, the SACVD process is a high pressure deposition process, which will completely seal the cavities 50a, 50b and 50c. For example, the SACVD process can be performed at higher pressures, e.g., 200 to 600 Torr, which eliminates bouncing or vibration effects of the beam. Also, in this process, at best, some material 56 may be deposited on the fixed side 20b of the beam structure (suspended electrode) 20, but this will not affect the performance of the MEMS structure.

Table 1, below, shows a comparison table between structures formed using conventional vent formation and sealing processes vs. vent formation and sealing processes of the present invention. More specifically, as shown in Table 1, the post SACVD process for sealing the conventional vent hole will result in depositing of material on the moving end 20a of the beam structure 20 of a conventional structure. This material variability can add upwards of approximately 60 nm of material on the beam, e.g., a resulting beam thickness can be about 85 nm to about 115 nm, which may result in lower yields and other issues discussed herein due to stress gradients on the beam, which cause the released beam shape to shift or change.

In comparison, the structure formed with the vent formation and sealing processes of the present invention eliminates or nearly eliminates any material variability on the moving end 20a of the beam structure 20 during the sealing process. That is, as shown in Table 1, the oxide layer of the beam structure will remain at about 60 nm, even after the SACVD sealing process. This shows that there is no material deposition at the moving end 20a of the structure (suspended electrode) 20, thus eliminating the disadvantages presented by the conventional structures and processes as already described herein.

TABLE 1

| Processes | Material Variability in Conventional processes | Material Variability Implementing the Present Invention |
| --- | --- | --- |
| Last Oxide Deposition on Cantilever Beam | 80 nm | 80 nm |
| Post Venting through vent holes | 56 nm | 56 nm |
| Post PECVD Silane Process | 56 nm | 56 nm |
| Post SACVD Silane Process | 85 nm to 115 nm | 56 nm |

Figure 6A:
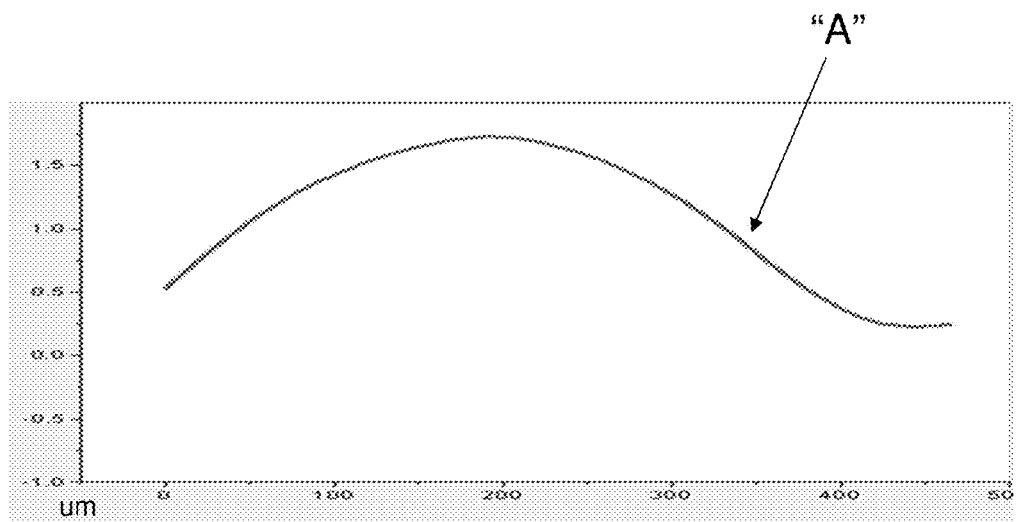
FIGS. 6a and 6b graphically show variation in beam shape between conventional vent formation and sealing processes vs. vent formation and sealing processes of the present invention.
Figure 6B:
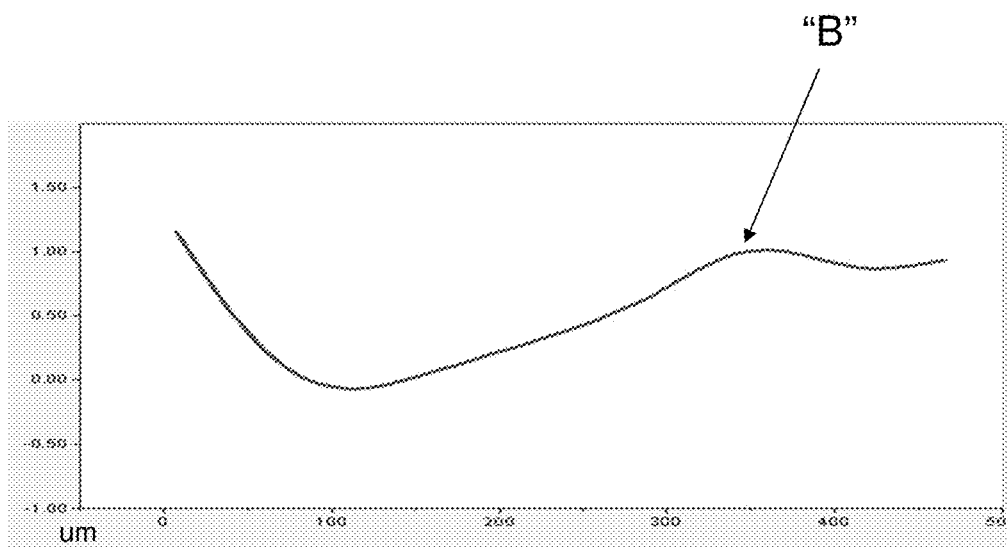

FIGS. 6a and 6b graphically show the variation in beam shape between the use of conventional vent formation and sealing processes vs. the vent formation and sealing processes of the present invention. More specifically, as shown in FIG. 6a, the beam shape "A" is slightly bent downwards due to the tensily stressed material deposition on the free end of the cantilever beam. In comparison, as shown in FIG. 6b, he beam shape "B" of the present invention is substantially flat. This advantageously will eliminate unwanted actuation of the MEMS structure, e.g., due to an application of an RF signal, as well as providing a more stable Cmin, e.g., minimize Cmin variability, while addressing the remaining issues described herein.

Figure 7:
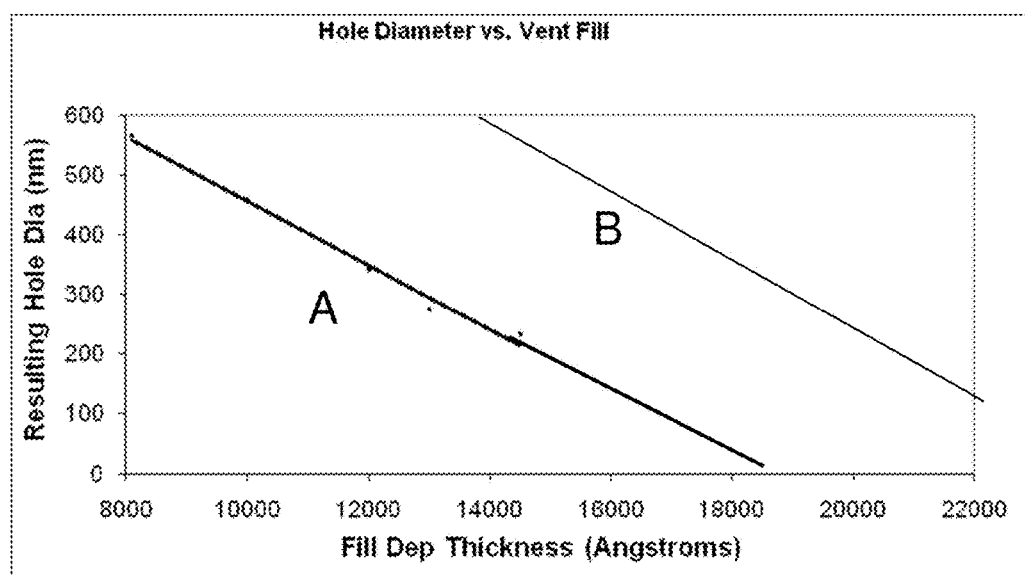
FIG. 7 shows a graph of resulting hole diameter (in nm) vs. fill deposition thickness (in A), in order to determine process parameters in implementing the present invention.

FIG. 7 shows a representative graph of resulting hole diameter (in nm) vs. fill deposition thickness (in Angstroms), in order to determine process parameters in implementing the present invention. More specifically, the Y axis shows the resulting hole diameter in nm, and the X axis shows the fill deposition thickness in Angstroms, for a PECVD silane oxide thickness. As shown in FIG. 7, line "A" represents a hole size of 1 µm and line "B" represents a hole size of 1.5 µm. In the graph of FIG. 7, for example, a deposition of PECVD oxide on the order of 1.4 µm will provide a resulting hole diameter of 0.3 µm, for an initial hole size of approximately 1.0 µm.

By using this chart, it is possible to obtain pinch off the smaller vent hole 24a and obtain the desired dimension of the larger vent hole 24b, with a PECVD oxide deposition. This will ensure that the smaller vent hole 24a will be sealed during the PECVD process, while the larger vent hole 24b will remain open (vent hole 24b), even after breadloafing. Accordingly, as should be understood by those of skill in the art, similar charts can be used for different deposition processes and vent hole sizes in order to fine tune the process for different process variables, i.e., deposition processes and vent hole sizes.

Accordingly, and as now should be understood by those of skill in the art, the present invention provides many advantages over the conventional structures and processing steps. For example, the present invention will:

(i) Eliminate or minimize deposition of material on the moving end of the MEMS beam structure (or other structure as described herein);

(ii) Ensure that a high pressure sealing deposition method, i.e., SACVD, can be used to seal the cavity structure, without affect material properties of the MEMS beam structure (or other structure as described herein);

(iii) Reduce unwanted bounce or vibration from the MEMS beam structure (or other structure as described herein), while still eliminating material variability at the moving end of the beam structure;

(iv) Eliminate unintended actuation of the MEMS beam structure, e.g., upon the application of an RF signal;

(v) Minimize Cmin variations in the MEMS beam structure and provide a stable zero voltage in an non-actuated state; and (vi) Increase overall yields.

Figure 8:
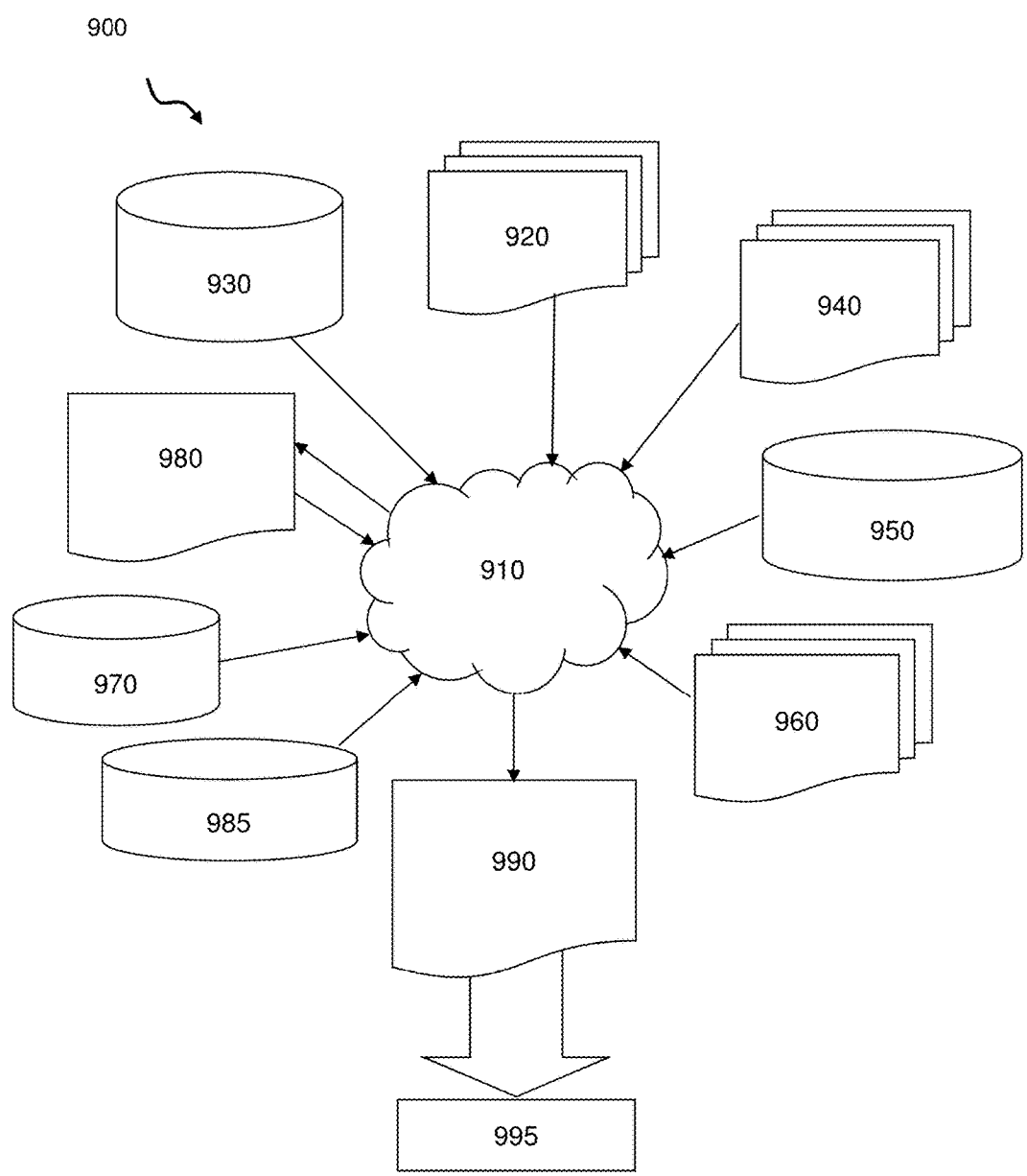
FIG. 8 is a flow diagram of a design process used in semiconductor design, manufacture, and/or test.

FIG. 8 is a flow diagram of a design process used in semiconductor design, manufacture, and/or test. FIG. 8 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-5. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-5. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-5 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-5. In one embodiment, design structure 990 may comprise a compiled, executable HDL simulation model that functionally simulates the devices shown in FIGS. 1-5.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-5. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
a beam structure located within a cavity;
at least one vent hole positioned over a free end of the beam structure, the at least one vent hole having a first size; and
at least another vent hole positioned over a fixed end of the beam structure, the at least another vent hole having a second size, larger than the first size,
wherein the at least one vent hole is sealed with a first material and the at least another vent hole is sealed with the first material and a second material, and
the second material is deposited on the fixed end of the beam structure and the free end of the beam structure is devoid of the first material.

2. The structure of claim 1, wherein the first material is PECVD silicon dioxide and the second material is SACVD silicon dioxide.

3. The structure of claim 1, wherein the first size is 1 micron in diameter and the second size is 1.5 micron in diameter.

4. The structure of claim 1, wherein the free end is a moving end of the beam structure.

5. The structure of claim 1, wherein the beam structure comprises:
a lower electrode;
an insulator material over the lower electrode;
an upper electrode over the insulator material; and
another insulator material on the upper electrode.

6. The structure of claim 5, wherein the upper electrode over the insulator material has a thickness which balances an overall volume of the beam structure.

7. The structure of claim 5, wherein the lower electrode and the upper electrode comprises aluminum copper.

8. The structure of claim 1, wherein the first material partially forms on corners of the at least another vent hole such that the at least another vent hole becomes narrowed with the first material while the at least one vent hole is completely filled.

9. The structure of claim 8, wherein the second material covers the first material and fills the at least another narrowed vent hole.

10. The structure of claim 9, wherein the at least one vent hole comprises a plurality of vent holes on the free end of the beam structure comprising a moving end of the beam structure, and the another at least another vent hole comprises one vent hole on the fixed end of the beam structure comprising a fixed side of the beam structure.

11. The structure of claim 8, wherein the at least another vent hole is narrowed to about 0.3 microns in diameter.

* * * * *